United States Patent
Peng

(10) Patent No.: US 6,582,984 B2
(45) Date of Patent: Jun. 24, 2003

(54) METHOD FOR FABRICATING AN ORGANIC LIGHT EMITTING DIODE

(75) Inventor: Kuang-Chung Peng, Taipei (TW)

(73) Assignee: Helix Technology Inc., Hsinchu (TW)

( * ) Notice: Subject to any disclaimer, the term of this patent is extended or adjusted under 35 U.S.C. 154(b) by 127 days.

(21) Appl. No.: 09/805,418

(22) Filed: Mar. 13, 2001

(65) Prior Publication Data

US 2002/0055210 A1 May 9, 2002

(30) Foreign Application Priority Data

Nov. 7, 2000 (TW) ........................................ 89123457 A

(51) Int. Cl.$^7$ .............................................. H01L 21/00
(52) U.S. Cl. .......................................................... 438/44
(58) Field of Search ................................... 438/42, 43–44, 438/46–47, 33–35

(56) References Cited

U.S. PATENT DOCUMENTS

| | | | | |
|---|---|---|---|---|
| 5,242,558 A | * | 9/1993 | Matsushima et al. | 205/766 |
| 5,733,609 A | * | 3/1998 | Wang | 427/561 |
| 5,847,448 A | * | 12/1998 | Val et al. | 257/686 |
| 5,900,327 A | * | 5/1999 | Pei et al. | 428/690 |
| 6,010,796 A | * | 1/2000 | Kijima | 428/690 |
| 6,057,048 A | * | 5/2000 | Hu et al. | 428/690 |
| 6,072,517 A | * | 6/2000 | Fork et al. | 347/237 |

FOREIGN PATENT DOCUMENTS

| | | | | |
|---|---|---|---|---|
| JP | 40 1-276549 | * | 11/1989 | H01J/13/15 |

OTHER PUBLICATIONS

Derwent Abstracted Publication Number JP401276549A. "Fluroescent Character Display Panel" Takagi et al. Nov. 7, 1989. (Abstract only, corresponds with figures of Japanese application above).*

Dubowski "Laser–based technologies for photonic device integration" Focus on Laser Precision Microfabrication. RIFKEN Review No. 32 (Jan. 2001). Also http://www.riken.go.jp/lab–www/library/publication/review/pdf/No_32/32_047.pdf<visitied Nov. 14, 2002>.*

* cited by examiner

Primary Examiner—Craig Thompson
(74) Attorney, Agent, or Firm—J. C. Patents

(57) ABSTRACT

A method for fabricating an organic light emitting diode. The method uses a mask to create an anode position by etching on a substrate and forming a plural groove in the substrate. Next, the anode is formed on the bottom of the groove. A dot-matrix type mask is used to form the organic emitting layer over the anode and under a predetermined cathode position. A hole injection layer, hole transport layer and an electron transport layer are formed inside the groove. More particularly, the total thickness of the anode, the organic emitting layer, the hole injection layer, the hole transport layer and the electron transport layer is equal to the depth of the groove to provide a smooth surface of the substrate. Finally, another mask is utilized on the substrate to form a strip shaped cathode, thus completing the fabrication of the organic light emitting diode.

14 Claims, 5 Drawing Sheets

METHOD FOR FABRICATING AN ORGANIC LIGHT EMITTING DIODE

CROSS-REFERENCE TO RELATED APPLICATION

This application claims the priority benefit of Taiwan application serial no. 89123457, filed Nov. 7, 2000.

BACKGROUND OF THE INVENTION

1. Field of Invention

The present invention relates to a method for fabricating a light emitting diode. More particularly, the present invention relates to a method for fabricating an organic light emitting diode.

2. Description of Related Art

The organic light emitting diode (OLED) utilizes an emissive characteristic organic film between two electrodes. When the direct currency voltage is charged to the electrodes, a hole will be injected from the anode, and an electron will be injected from the cathode. Because of the potential difference created by the applied voltage, the carrier moves and combines in the thin film, and a part of the electron-hole combines with the electron to release energy that will emit and stimulate the particle, thus forming a single stimulative particle. When the single stimulative particle releases the energy back to the substrate, there is a standard ratio of the energy that is released and radiated by emitting a photon. The above description is that of an organic light emitting diode.

An energy band model is usually used to describe an electric charge movable model. However, because organic material is unlike metal or a semiconductor, it will create a wide energy band. Therefore, the energy band of the organic material actually can form a continuous energy level by the electron-hole. This energy band model can easily explain the procedure after the electric charge injects from the electrode, combines between the energy gaps and emits a photon.

The basic substrate structure of the organic light emitting diode is glass and adds an emissive characteristic organic semiconductor between a metal cathode and a transparency indium-tin-oxide (ITO) anode. More particularly, the carrier can easily reach a balance between the injection and the transportation in the multi-layer structure of the organic semiconductor layer. The structure uses a thin film that includes an electron-hole injected by an electric charge and transmitted to the hole transport layer. The electron-hole combines with the electron and emits light on the emitting layer. The structure also includes a hole injection layer. When the voltage is low, an electron-hole still can be injected into the organic layer.

Accordingly, the color display can be a single color and a multi-color display. If the display is a single color display, it has one emitting layer. If it is a multi-color (red, green and blue, the tricolor) display, it can be formed by a shiftable mask.

FIG. 1 illustrates a conventional structure of an organic light emitting diode. Referring to FIG. 1, a glass substrate 100 has a plurality of strip-shaped anodes 110. On top of the anodes 110 is a multi-layer structure 120. This multi-layer structure 120 includes a hole injection layer 122, a hole transport layer 124, an organic emitting layer 126 and an electron transport layer 128. On top of the multi-layer structure 120 is a plurality of strip-shaped cathodes 130.

FIG. 2A through FIG. 2D show the method for fabricating a conventional organic light emitting diode.

Referring to FIG. 2A, an indium-tin-oxide (ITO) layer is formed over a glass substrate 200. Then, using a normal photolithography and etching process, the indium-tin-oxide layer is etched to form a plurality of strip-shaped anodes 210.

Referring to FIG. 2B, a polymer layer 212 is formed between each anode and is used for insulation. In addition, this polymer layer 212 can be flat on the surface of the substrate. But the material of the polymer layer 212 is not very stable and easily changes its shape, so it is does not work well. The polymer layer 212 is an extra coating for the space between the anodes 210.

Referring to FIG. 2C, a multi-layer structure 220 is formed on top of the anode 210. The multi-layer structure 220 includes a hole injection layer 222, a hole transport layer 224, an organic emitting layer 226 and an electron transport layer 228 in sequence. However, the polymer layer 212 is not very smooth; therefore, a multi-layer structure 220 subsequently is formed on an un-smooth surface.

Referring to FIG. 2D, the multi-layer structure 220 is covered by a mask, and a plurality of strip-shaped metal are formed to make cathode 230. The cathode 230 is placed perpendicular to the strip-shaped anode 210.

In the conventional method for fabricating the organic light emitting diode, the thickness of the anode is greater, and the anode is located on top of the substrate and has a non-flat surface after the process. Although the long strips of the anode and the cathode are insulated by the polymer layer, a cross talk interference problem can still occur.

Therefore, the purpose of this invention is to avoid the non-flat surface of the cathode metal that causes cross talk interference on the organic light emitting diode, which can cause less brightness and instability.

Also, the conventional method uses the polymer to create a smoother surface. This method is costly and also increases the process time. Therefore, this invention does not use a polymer for insulation and flattening, and it also can save time and cost.

SUMMARY OF THE INVENTION

The invention provides a method for fabricating an organic light emitting diode.

As embodied and broadly described herein, the invention provides a substrate and uses a mask to etch the substrate to provide a position for the anode. A plurality of grooves are then formed in the substrate. The anode is formed on the bottom of the groove. A dot-matrix type mask is used to form the organic emitting layer between the anode and the cathode, and to form the hole injection layer, the hole transport layer and the electron transport layer inside the groove. More particularly, the total thickness of the anode, the organic emitting layer, the hole injection layer, the hole transport layer and the electron transport layer is equal to the depth of the groove. Thus, the substrate can have a smooth surface. Finally, another mask is used on the substrate and forms the cathode strips that will complete the fabrication of the organic light emitting diode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The preferred embodiment of the invention will be described in accompaniment with the drawings of FIG. 3A through FIG. 3E which illustrate an organic light emitting diode.

Figure 1:
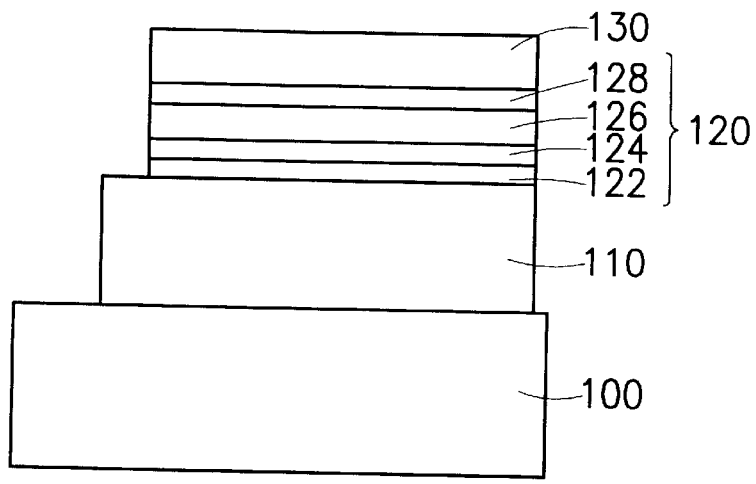
FIG. 1 is a structure illustrating a conventional organic light emitting diode.
Figure 2A:
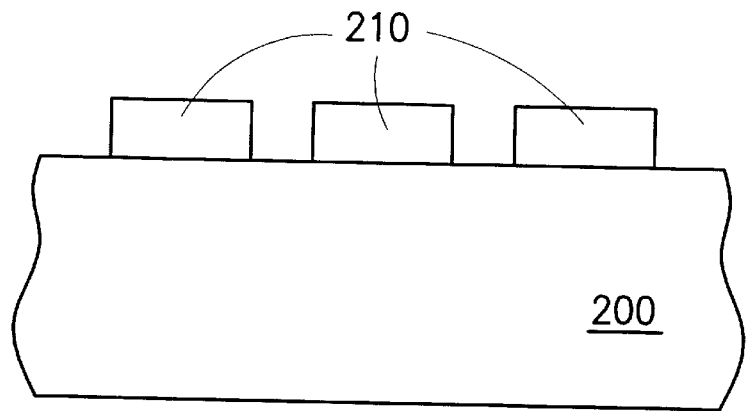
FIGS. 2A through 2D illustrate the steps for fabricating a conventional organic light emitting diode.
Figure 2B:
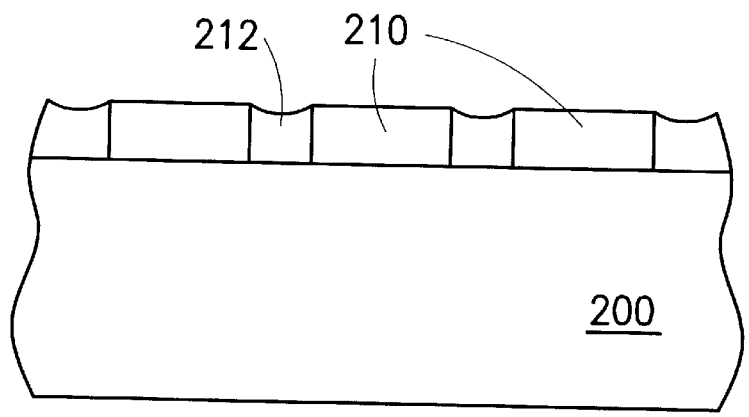
Figure 2C:
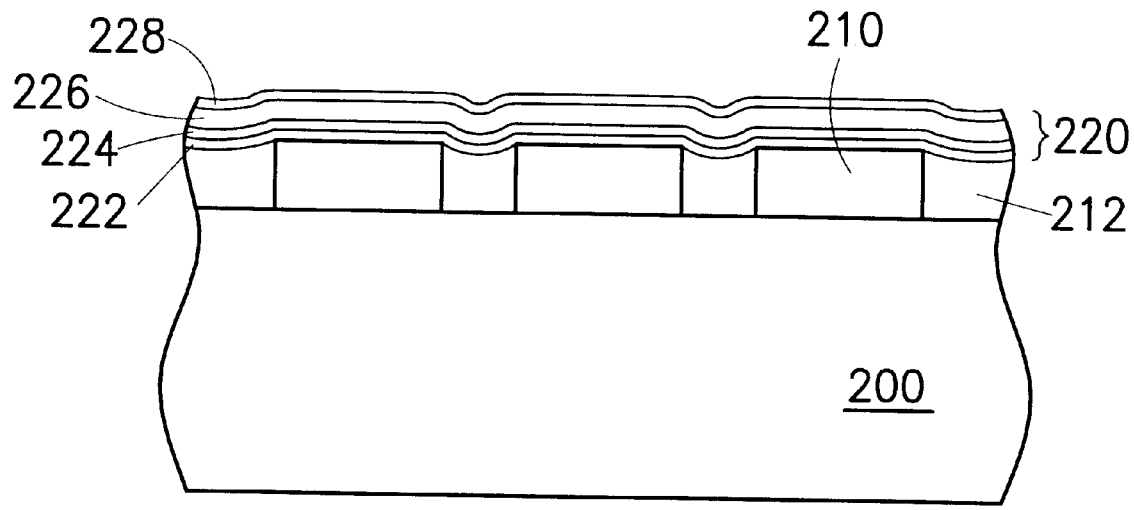
Figure 2D:
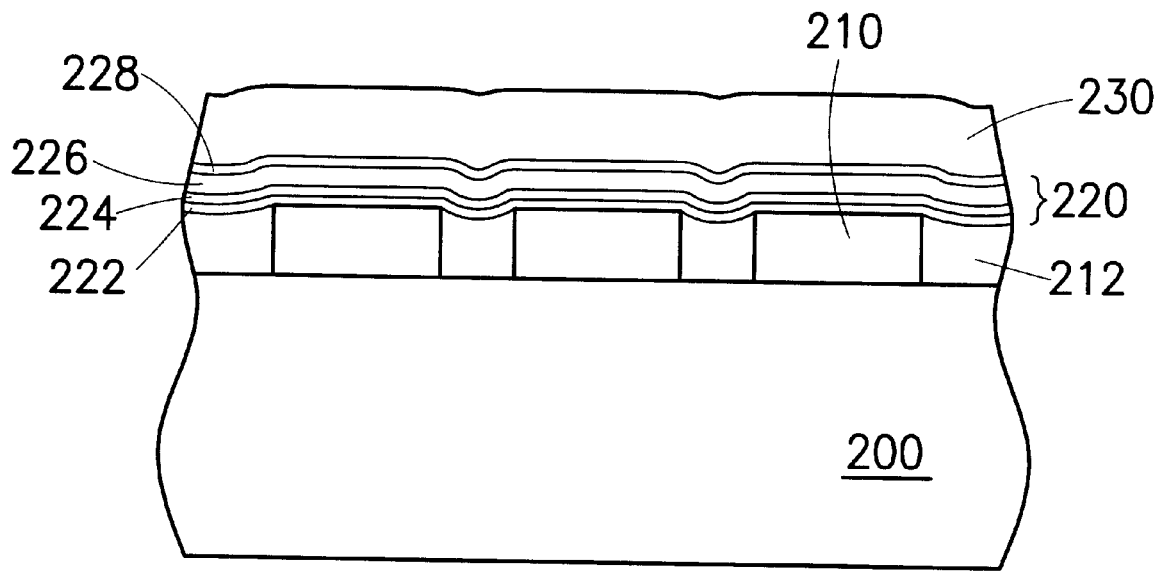
Figure 3A:
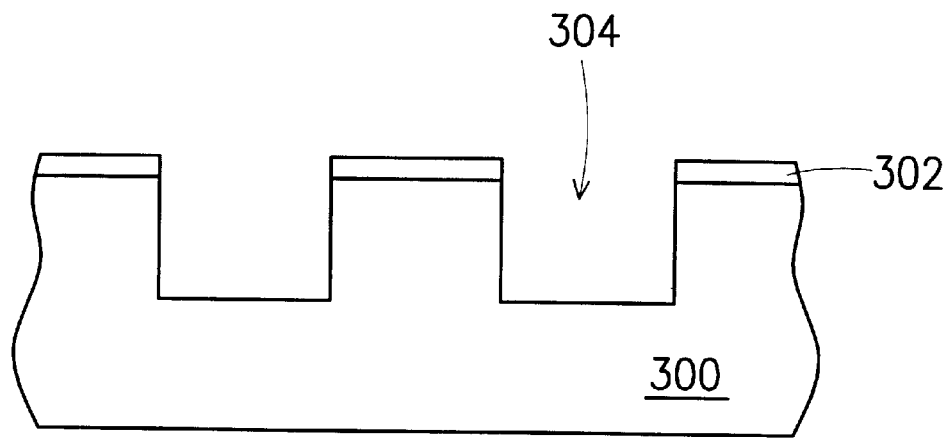
FIGS. 3A through 3E illustrate the steps of the organic light emitting diode according to one preferred embodiment of this invention.

Referring to FIG. 3A, a substrate 300 is provided. The substrate is made of glass or plastic, for example. A mask 302 is formed on top of the substrate 300 and marks the anode position. Then the substrate 300 is etched using the mask 302 to form the plural groove 304 on the substrate 300. The method of etching the substrate is plasma dry etching, laser carving, dry-wet etching or engraving. The depth of the groove 304 is equal to the total thickness of the anode, the organic emitting layer, the hole injection layer, the hole transport layer and the electron transport layer.

The groove 304 is forming to mark a place for the anode. It can reduce the cost of the conventional method that forms a polymer for insulating between two anodes. The material of the substrate 300 is very stable, and it can replace the polymer to have an even smoother surface.

Figure 3B:
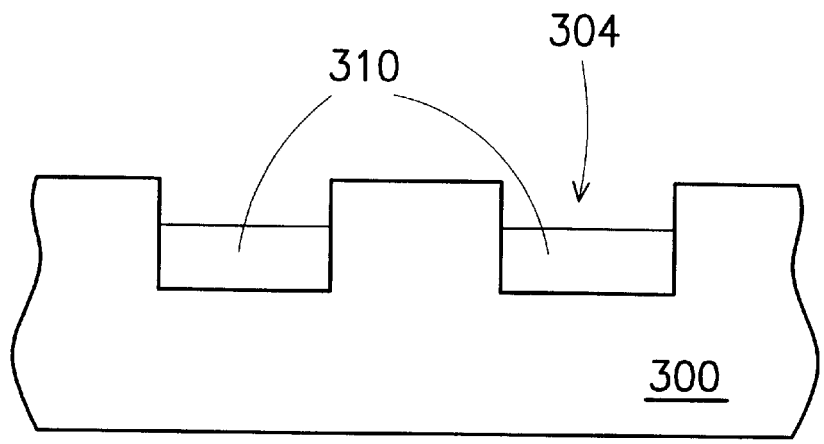

Referring to FIG. 3B, an anode 310 is formed on the bottom of the groove 304. The anode is formed by depositing an indium-tin-oxide layer in the groove 304, and then etching back the extra indium-tin-oxide that coats the top of the substrate. Or, when the substrate 300 is etched to form the grooves 304 (see FIG. 3A), controlling the etching ratio creates a groove 304 that is narrow on the top and wide in the bottom. Then an indium-tin-oxide is formed by sputtering deposition on the bottom of the groove 304 and becomes the anode 310. The thickness of the anode 310 is approximately 1500 Å~2500 Å.

Figure 3C:
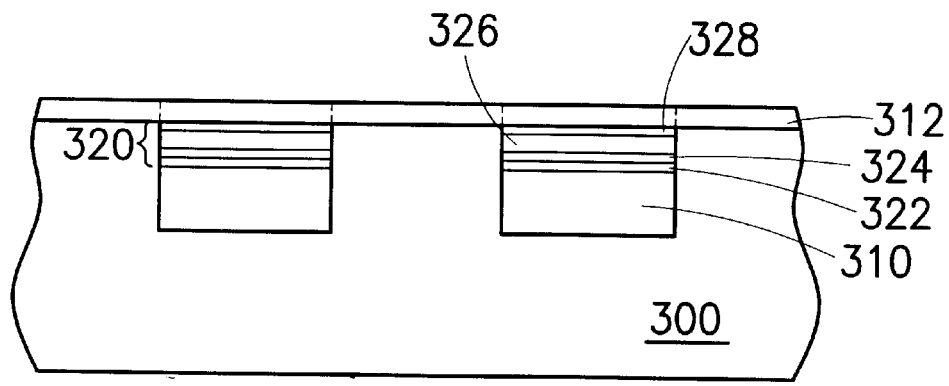

Referring to FIG. 3C, an organic emitting layer 326 is formed under the preformative cathode spots, which are not shown in the diagram. The method of forming the organic emitting layer 326 uses a dot-matrix type of a metal mask 312 to form the organic emitting layer 326 under the preformative cathode spots and over the anode 310. The thickness of the organic emitting layer 326 is approximately 550 Å~650 Å. If the organic light emitting diode is multicolor (including the tricolors of red, green and blue) and the organic emitting layer can be formed by using a different type of dot matrix metal mask. In addition, in the structure of an organic light emitting diode, the structure of the multi-layer 320 that allows the carriers to easily reach a balance by injection and transportation. The structure of the multi-layer 320 includes a hole injection layer 322, a hole transport layer 324 and an electron transport layer 328. The multi-layer structure 320 can be formed inside the groove 304. The total thickness of the hole injection layer 322, the hole transport layer 324 and the electron transport layer 328 is approximately 250 Å~350 Å.

Figure 3D:
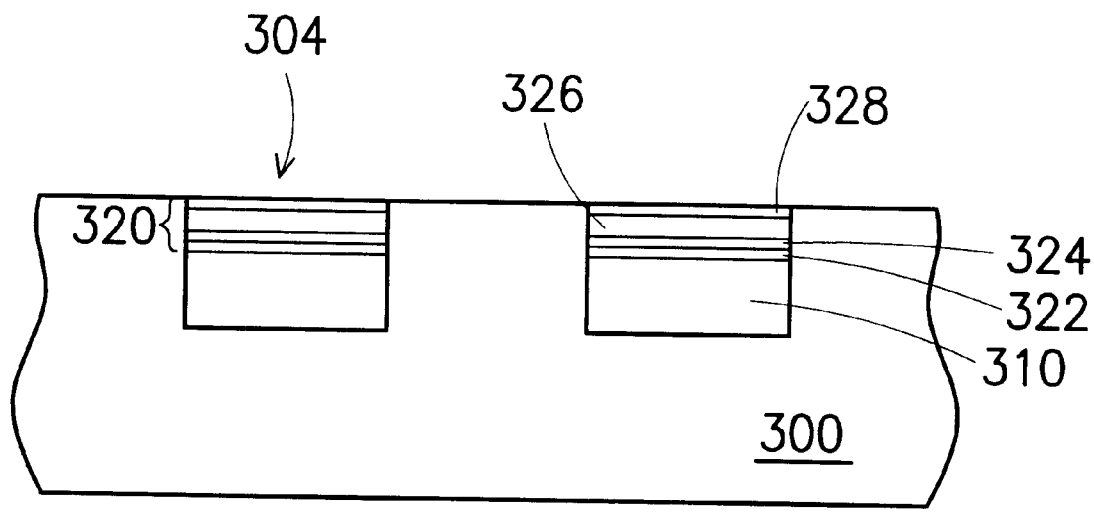

Referring to FIG. 3D, the material layers inside the groove 304 include the anode 310 and the multi-layer 320, and the total thickness is equal to the depth of the groove 304. The surface of the substrate 300 is smooth. The total thickness of the anode 310, the organic emitting layer 326, the hole injection layer 322, the hole transport layer 324 and the electron transport layer 328 are equal to the depth of the groove 304. Therefore, the surface of the substrate 300 is smoother when those materials fill in the groove.

Figure 3E:
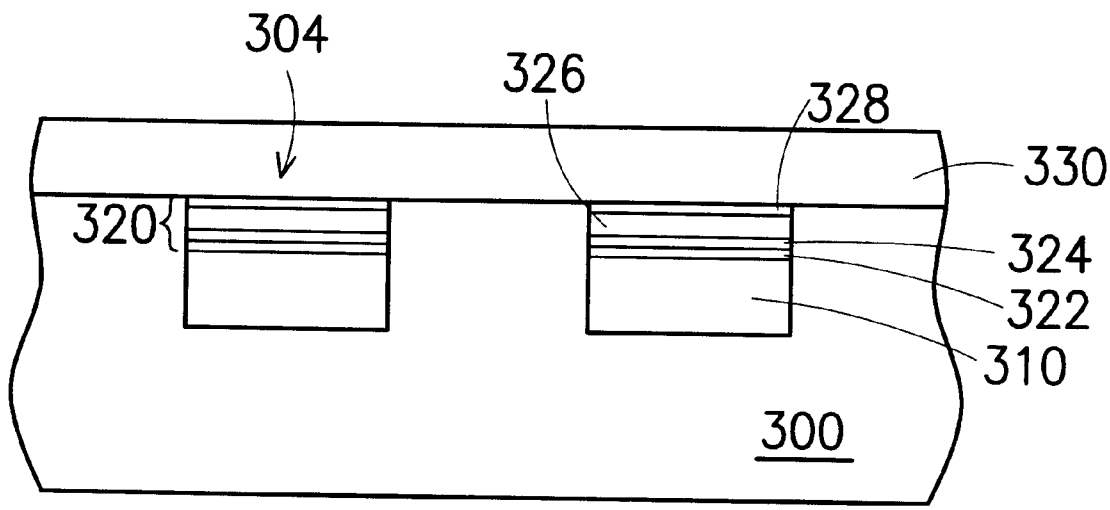

Referring to FIG. 3E, another mask is defined on the substrate 300 to form a strip-shaped metal layer, which is the cathode 330 of the organic light emitting diode. The cathode is perpendicular to the groove 304. This is the final fabricating step of the organic light emitting diode.

Figure 3F:
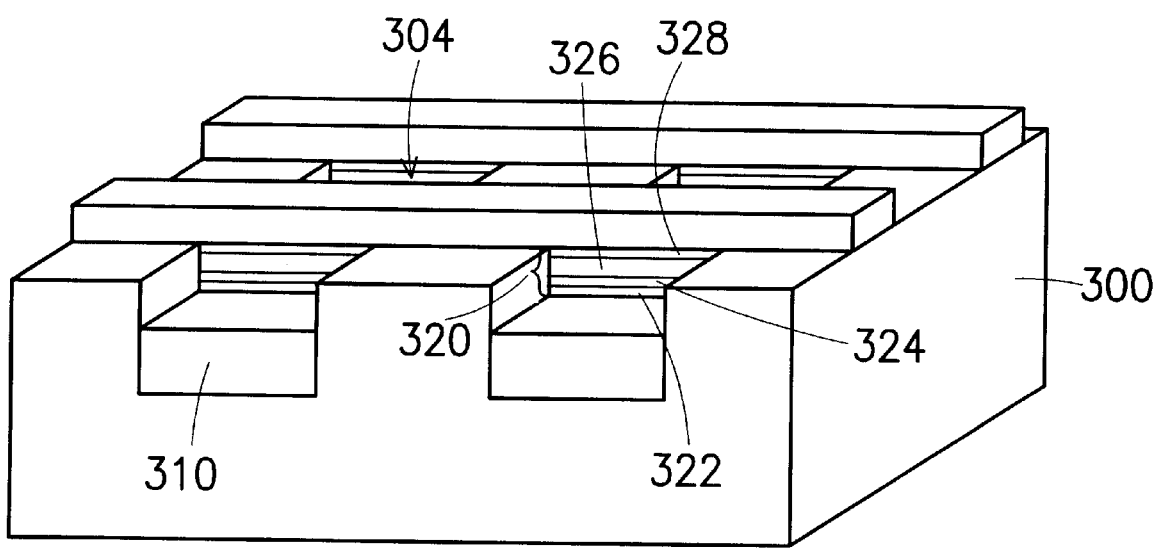
FIG. 3F is a three-dimensional diagram illustrating the organic light emitting diode corresponding to FIG. 3A through FIG. 3E.

Referring to FIG. 3F, a three dimensional diagram of the organic light emitting diode according to the fabrication diagrams from FIG. 3A through FIG. 3E is provided. The substrate includes a plurality of strips that are parallel to the groove 304. On top of the substrate 300 are a plurality of cathode strips perpendicular to the groove 304. On the bottom of the groove 304 is the anode 310. On top of the anode 310 is the multi-layer structure 320 that is right under the cathode strip 330. The multi-layer structure 320 includes the organic emitting layer 326, the hole injection layer 322, the hole transport layer 324 and the electron transport layer 328. The total thickness for both the anode and the multi-layer is equal to the depth of the groove 304. The organic light emitting diode comprises of the organic emitting layer 326 that is between the anode 310 and the cathode 330.

In the conventional design, the entire anode, organic emitting layer, cathode and multi-layer structure are all located on top of the substrate surface. The thickness of the anode is very thick at approximately a few thousands Angstroms deep. The thickness of the organic emitting layer and the multi-layer structure are very thin and only a few hundred angstroms deep. Therefore in the conventional design, the polymer is formed in the space between the anodes and makes a smoother surface, but cross talk interference still occurs either between the anodes or between the anode and the cathode. Therefore, this invention provides a groove to place the anode, the organic emitting layer and the multi-layer structure. It will prevent the problem of cross talk interference.

In view of the foregoing description, there are at least the advantages listed below to this invention:

First, the anode and the cathode are located at different levels, in that the anode is located on the bottom of the groove and the cathode is on top of the substrate. Therefore, they can avoid interference from their neighbor, and brightness and stability are increased. Second, the organic layer must be located under the cathode. Therefore the insulation is the vacuum or the nitrogen during the later packaging process. Third, the polymer is used for smoothening the surface of the substrate in the conventional method. It will increase cost and the time. Therefore, this invention utilizes the groove for insulating the anodes and smoothening the surface of the substrate. It can save fabrication time and cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an organic light emitting diode, comprising:

providing a substrate;

forming a plurality of grooves in the substrate;

forming an anode on a bottom of the grooves;

forming an organic emitting layer over the anode; and forming a plurality of cathodes over the substrate.

2. The method as claimed in claim 1, wherein the method for fabricating the groove comprises using a mask to etch the substrate by plasma dry etching.

3. The method as claimed in claim 1, wherein the method for fabricating the groove comprises using a mask to etch the substrate by laser carving.

4. The method as claimed in claim 1, wherein a total thickness of the anode and the organic emitting layer formed in the groove is equal to the depth of the groove.

5. The method as claimed in claim 1, wherein the method for fabricating the organic emitting layer comprises using a dot-matrix type metal mask to form the organic emitting layer that determines the position of the cathode.

6. The method as claimed in claim 1, wherein a hole injection layer and a hole transport layer are formed between the organic emitting layer and the anode.

7. The method as claimed in claim 6, wherein each the thickness of the hole injection layer and the hole transport layer is approximately 300 Å~700 Å.

8. The method as claimed in claim 1, wherein an electron transport layer also is formed between the organic emitting layer and the cathode strips.

9. The method as claimed in claim 8, wherein the thickness of the electron transport layer is approximately 300 Å~700 Å.

10. The method as claimed in claim 1, wherein the thickness of the organic emitting layer is approximately 450 Å~950 Å.

11. The method as claimed in claim 1, wherein the material of the substrate is either glass or plastic.

12. The method as claimed in claim 1, wherein the material of the anode is indium-tin-oxide (ITO).

13. The method as claimed in claim 1, wherein the thickness of the anode is approximately 1500 Å~2500 Å.

14. The method as claimed in claim 1, wherein the method for fabricating the cathode uses a mask formed over the substrate and to form the cathode strips.

* * * * *